United States Patent [19]
Guiberteau et al.

[11] Patent Number: 5,012,084
[45] Date of Patent: Apr. 30, 1991

[54] MICROWAVE SAMPLE-AND-HOLD UNIT WITH TRANSISTOR

[75] Inventors: Christian Guiberteau, Longoumeau; Stéphane Ruggeri, Viry; Michèle Le Paih, Bievres, all of France

[73] Assignee: Thomson Composants Microondes, Puteaux, France

[21] Appl. No.: 470,141

[22] Filed: Jan. 25, 1990

[30] Foreign Application Priority Data

Feb. 7, 1989 [FR] France ................................ 8901532

[51] Int. Cl.⁵ ............................................ H01J 40/14
[52] U.S. Cl. .................................. 250/211 R; 250/551
[58] Field of Search ........................... 250/551, 211 R; 307/311, 352; 357/19

[56] References Cited

U.S. PATENT DOCUMENTS

| | | | |
|---|---|---|---|
| 4,068,135 | 1/1978 | Sonobe et al. | 307/352 |
| 4,140,914 | 2/1979 | Jones | 250/551 |
| 4,369,371 | 1/1983 | Hara et al. | 250/551 |
| 4,629,901 | 12/1986 | Nishizawa | 357/19 |

OTHER PUBLICATIONS

Patent Abstracts of Japan, vol. 4, No. 185 (E-38), Dec. 19, 1980, & JP-A-55 127 706, M. Hideki, "Frequency Optical Control System of Superhigh Frequencyactive Circuit".

IBM Technical Disclosure Bulletin, vol. 29, No. 5, Oct., 1986, pp. 1968–1969, New York, US, "Subpicosecond Optical Sampling Gate".

Patent Abstracts of Japan, vol. 9, No. 75 (E-306), Apr. 4, 1985, & JP-A-59 210 701, M. Hideki, "Switching Device for Path of Ultrahigh Frequency Bandsignal".

Primary Examiner—David C. Nelms
Assistant Examiner—Stephone B. Allen
Attorney, Agent, or Firm—Oblon, Spivak, McClelland, Maier & Neustadt

[57] ABSTRACT

Disclosed is a microwave (1 GHZ) sample-and-hold unit having a field-effect transistor, to which an input signal is applied, and a storage capacitor. The transistor is made of materials of the III-V group, such as GaAs or InP, and Its channel region is controlled by an optical control device formed by an optic fiber and a pulsed laser semiconductor. In order to reduce the switching time of the transistor, this transistor and the laser are both biased at points close to their thresholds. The disclosed device can be applied in signal processing, at frequencies of the order of 1 GHz.

10 Claims, 1 Drawing Sheet

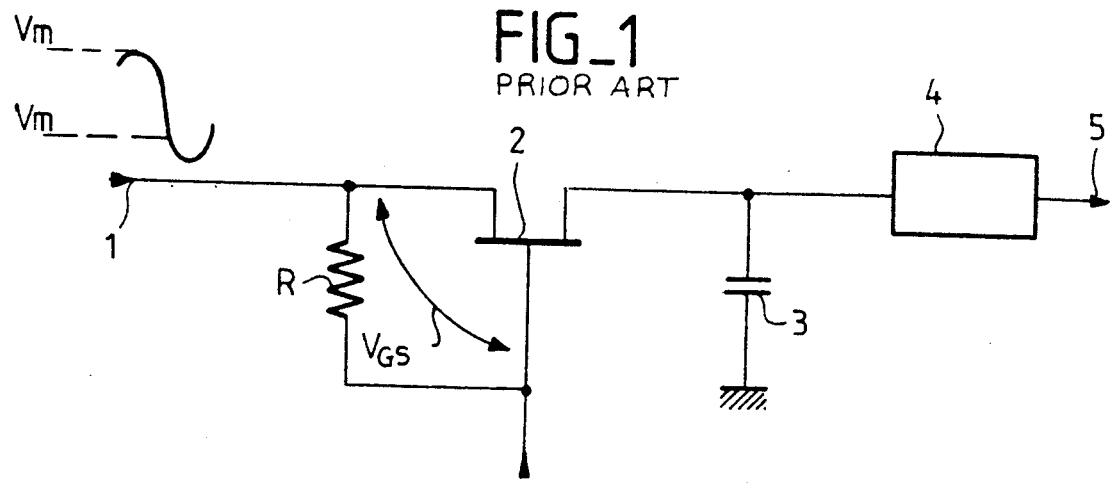
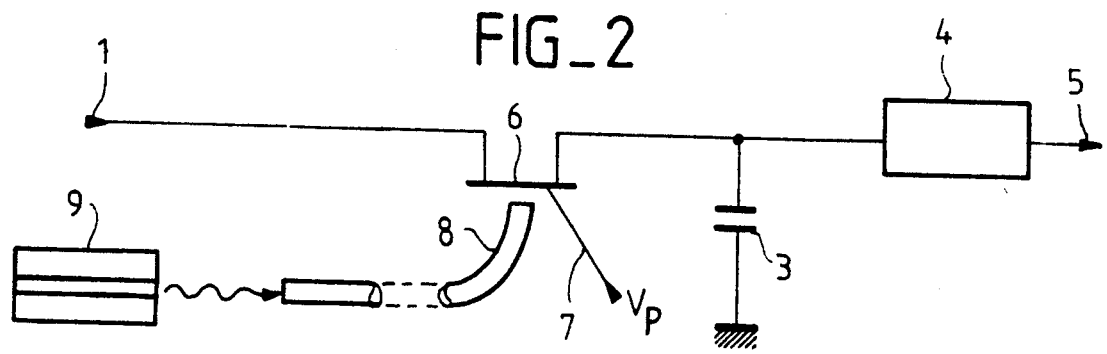
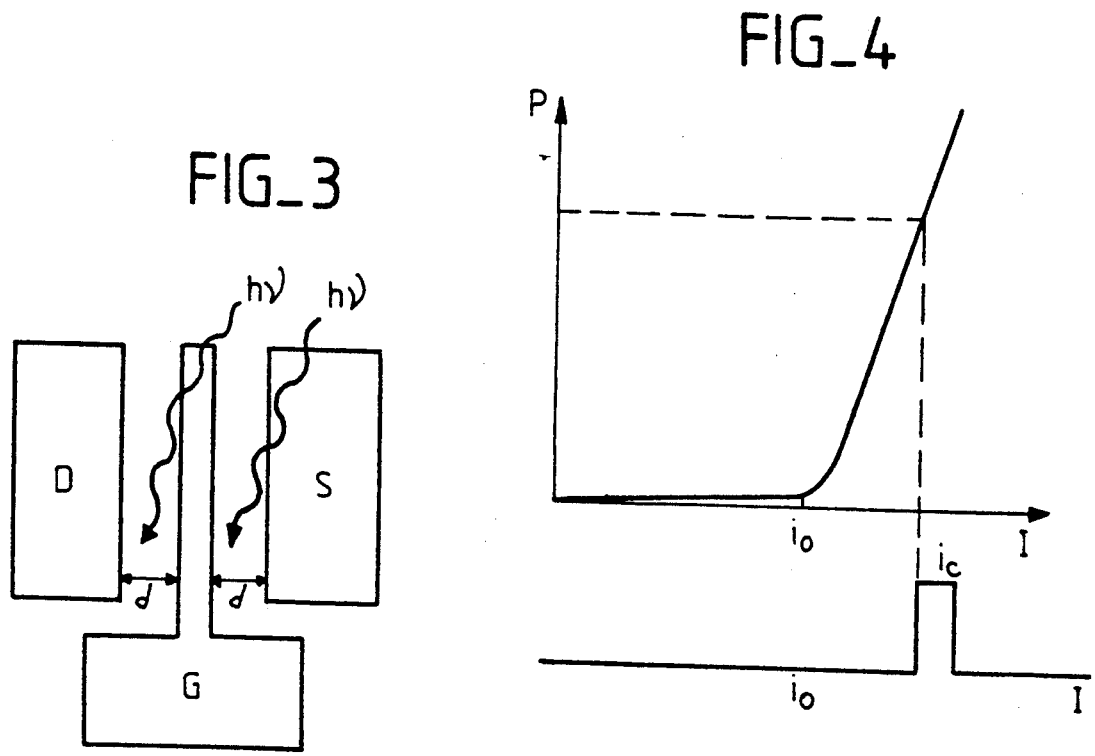

MICROWAVE SAMPLE-AND-HOLD UNIT WITH TRANSISTOR

BACKGROUND OF THE INVENTION

1. Field of the Invention

The present invention concerns a sample-and-hold unit, the sampling switch of which is a field-effect transistor. It is characterized in that the transistor is optically controlled, either by means of a semiconductor laser directly coupled to the gate region of the transistor or by means of a laser and an optic fiber. The optical control of the transistor, which is made of group III-V materials such as GaAs or InP, enables the sample-and-hold unit to work at frequencies of the order of at least 1 GHz.

2. Description of the Prior Art

Transistor-using sample-and-hold units, such as the one shown in FIG. 1, are well known. An analog signal (symbolized by a sinusoid) is applied to the input 1 of the sampler, at the source of a transistor 2 which acts as a switch. This transistor often is a field-effect transistor, and it may be made of silicon or of III-V materials such as GaAs, depending on the working frequency. When the transistor 2 is conductive, the signal charges a storage capacitor 3. At the output 5, an output interface 4 delivers sampled values which, depending on the nature of the interface, are amplified or digitalized or mixed with other values etc.

The transistor 2 is controlled at its gate by a train of pulses represented by a voltage $V_i$. The gate and the source are joined by a load R so that, in a tracking period, the gate and source potentials are equal. In this standard type of system, the electron/hole pairs are created electrically.

In fact, this system which is perfectly suited to relatively low frequencies (in megahertz), has defects that get aggravated with the rise in frequency. For, the voltage $V_{GS}$ between the gate and the source, which controls the opening and closing of the channel, is the sum of the voltage of the analog signal and of the pulse voltage $V_i$. Depending on whether the analog signal is sampled at a point where its voltage $V_M$ is close to the maximum or at a point where its voltage $V_m$ is close to the minimum, the voltage $V_{GS}$ varies because $V_M + V_i = V_m + V_i$. The result thereof is uncertainty over the switching instant of the transistor 2, hence uncertainty over the instant of sampling of the analog signal, the result of which is that the transistor loses its linearity with the rise in frequency.

Besides, the development of optic fibers to transmit information has led to a growing interest in having systems that can be directly controlled by light. Furthermore, the optical control of devices has a great many advantages such as the absence of electrical coupling and the insulation of the control circuit, the low amplitude of the optical control signal (some microwatts) compatible with the output levels of semiconductor lasers or electroluminescent diodes and immunity to jamming.

Now, it is known that materials of the III-V group such as GaAs, InP and their ternary and quaternary derivatives are sensitive to a light radiation of an appropriate wavelength: this opens up prospects of using systems in which integrated circuits simultaneously process optical signals and electronic signals.

SUMMARY OF THE INVENTION

It is, therefore, a first object of the invention to propose a sample-and-hold unit comprising a transistor made of group III-V materials controlled by a light of appropriate wavelength. To the gate of the transistor, there is applied a voltage very close to the sum of its threshold voltage and $V_m$: the switching of the transistor is controlled be a light ray coming from a semiconductor laser.

It is a second object of the invention to obtain a sample-and-hold unit with great linearity of response, and high sampling speed, because there is no longer any uncertainty over the switching instant of the switch formed by the transistor.

Yet another object of the invention is to obtain excellent immunity to the electromagnetic radiations and to stray electrical phenomena since the sample-and-hold unit is optically controlled.

Finally, the sample-and-hold unit according to the invention can be integrated into the chip of an integrated circuit, and the electrical power needed to actuate it is smaller than the power delivered by a laser semiconductor, and the power consumed by this laser is smaller than the power consumed by an electronic assembly fulfilling the same function.

More precisely, the invention consists of a microwave sample-and-hold unit, comprising a switch placed between the input of an electrical signal and a storage capacitor, wherein the switch is a field-effect transistor provided with an optical control device on its channel region.

BRIEF DESCRIPTION OF THE DRAWINGS

The invention will be understood more clearly from the more detailed description given of an exemplary embodiment, in referring to the appended drawings, of which:

FIG. 1 shows a prior art sample-and-hold unit described heretofore;

FIG. 2 shows a sample-and-hold unit according to the invention;

FIG. 3 is a drawing showing a plane view of the metallizations of a switch transistor in a sample-and-hold unit according to the invention;

FIG. 4 shows a response curve of a semiconductor laser used to control the transistor of a sample-and-hold unit according to the invention.

The schematic diagram of a sample-and-hold unit according to the invention is shown in FIG. 2. As in the prior art, an analog signal present at the input 1 is memorized in a capacitor 3 when the switch 6 is conductive for a very short time. An output interface 4 processes the samples stored in the capacitor 3 and delivers them to the output 5.

The original feature of this sample-and-hold unit is that the switch 6 is made of group III-V materials, the most frequently used ones of which are GaAs, $Al_x$-$Ga_{1-x}As$ and InP. It is therefore a field-effect transistor, the internal structure of which is a field-effect transistor. It may be a MESFET or a heterojunction transistor such as a TEGFET, and it may be normally off or normally on, provided that it is biased by a rate voltage sufficient to pinch the channel. The chief characteristic required of this transistor is that it should be sensitive to light, and should have a high cut-off frequency.

The distinction between the different types of absorption in the semiconductor material is related to the energy of the incident light beam with respect to the width of the forbidden band of the material.

Thus, when the energy of the incident radiation is equal to or greater than the width of the forbidden band of the material ($\nu > Eg$), there is intrinsic absorption of light. Electrons are transferred to the conduction band with conservation of the moment in the case of direct interband transition. The absorption threshold characterizes the energy of the incident radiationn for which we have $n\nu = Eg$.

The intrinsic absorption occurs when the wavelength of the incident radiation is such that:

$$\lambda(nm) < \frac{K}{Eg\,(ev)}$$

K being a coefficient.

GaAs is sensitive to a light radiation for which $\lambda \leq 869$ nm (at 300° K.), and InP is sensitive to a radiation $\lambda \leq 1500$ nm.

The coefficient of absorption characterizes the decrease in the incident flux of photons in the direction of propagation of the light radiation through the active layer of the transistor. This coefficient of absorption is a decreasing function of the doping, and the active layer of the transistor should therefore be highly doped $\geq 10^{18}$ at.cm$^{-3}$.

The transistor 6 is biased by a DC voltage $V_p$ applied to its gate by a metallization 7 in such a way that, when there is no illumination, it is at a point close to but below the sum of its threshold voltage and $V_m$: the transistor is off and the input signal at 1 is insulated from the storage capacitor 3.

However, the channel region of the transistor 6 is furthermore controller by an optical beam, shown schematically figure by optic fiber in which transmits the radiation produced by a semiconductor laser 8.

Of course, the optical control may be different: it may be achieved by the direct coupling of a laser and a transistor, or by a source of radiation other than a semiconductor laser. The optic fiber is purely a convenient means of coupling between a light source and the channel region of a transistor.

When the laser 9 emits a pulsed radiation, at a wavelength related to the material of the transistor, the optical signal creates electron/hole pairs in the depleted zone of the transistor. These electron/hole pairs provide for the circulation of a current between source and drain of the transistor, enabling the charging or discharging of the storage capacitor 3 until the input voltage is perfectly copied.

When the laser 9 is extinguished, the transistor 6 is in darkness and the input signal at 1 is isolated from the storage capacitor 3: the device 4 which follows the sample-and-hold unit expresses the precise value of the voltage stored in the capacitor 3.

The sample-and-hold unit according to the invention does not require any special geometry for the transistor 6. For, the sampling frequency obtained, namely 1 GHz, already represents a step forward with respect to prior art samplers, but it is limited by the charging time of the capacitor 3, equal to $R_{on}C$, $R_{on}$ being the conducting resistance and C being the capacitance.

Consequently, a transistor 6 which has a cut-off frequency greater than 1 GHz is suitable. It is known that the cut-off frequency of a transistor is partly a function of the drain-source distance. In FIG. 3, which represents a plane view of the drain, gate and source metallizations of the transistor 6, it is seen that the distances "d" between drain and gate and between gate and source are sufficient to enable the illumination of the underlying layers of the channel, at least in the range of frequencies mentioned, namely 1 GHz.

It has been stated that the transistor 6 is biased be a voltage $V_p$ in such a way as to be very close to its on/off switching point. To improve the system, and to get rid of the uncertainty about the opening of the transistor 6, the laser 9 too is kept close to its emitting threshold.

It is known (FIG. 4) that the optical power P emitted by a semiconductor laser is almost zero up to an intensity $i_0$, called a threshold intensity, of the current I injected into the laser. Beyond this intensity $i_0$, the optical power emitted grows very quickly. Since the laser 9 has to emit in pulsed mode, to open and then close the switch 6 alternately, the pulsed current that goes through the laser has a low value equal to or very close to $i_0$: as soon as a current pulse $i_c$ arrives, the laser starts emitting and, since the transistor 6 is itself close to its threshold, it switches over. Thus, there is no uncertainty as regards the moment of opening and closing of the transistor 6.

Furthermore, since there is no link between source and gate, the switching time of the transistor 6 is independent of the level of the input signal.

If an optic fiber or an optic first element is used to couple the laser 9 and the transistor 6, the multiple-mode fibers, having a core diameter of the order of 50 microns, are preferably used at 869 nm with GaAs, and the monomode fibers, with a core diameter of the order of 9 microns, are preferably used at 1500 nm, with InP.

The sample-and-hold unit according to the invention is used in instrumentation, in data processing by microwave integrated circuits or in integrated services digital networks.

What is claimed is:

1. A microwave sample-and-hold unit, comprising a switch placed between the input of an electrical signal and a storage capacitor, wherein the switch is a field-effect transistor provided with an optical control device on its channel region, and wherein the transistor is biased on its gate by a DC voltage $V_p$ which keeps the transistor at a point close to its threshold, independently of the value of the input signal.

2. A sample-and-hold unit according to claim 1, wherein the transistor includes at least one channel region made of materials of the III–V group such as GaAs, InP and their ternary and quaternary alloys.

3. A sample-and-hold unit according to claim 1, wherein, should the transistor be made of GaAs or its alloys, the laser emits a pulsed radiation with a wavelength $\leq 869$ nm.

4. A sample-and-hold unit according to claim 1, wherein, should the transistor be made of InP or its alloys, the laser emits a pulsed radiation with a wavelength $\leq 1500$ nm.

5. A sample-and-hold unit according to claim 1, wherein, in order to reduce the uncertainty over the switching time of the transistor, the semiconductor laser is biased by a DC current correspondent to its threshold of optical emission.

6. A microwave sample-and-hold unit, comprising a switch placed between the input of an electrical signal and a storage capacitor, wherein the switch is a field-effect transistor provided with an optical control device on its channel region, and wherein the optical control of the channel region of the transistor, which gets added to the DC bias of the gate, is formed by an optic fiber element and laser semiconductor pulsed at the sampling frequency of the sample-and-hold unit.

7. A sample-and-hold unit according to claim 6 wherein, should the transistor be made of GaAs or its alloys, the laser emits a pulsed radiation with a wavelength h≦869 nm.

8. A sample-and-hold unit according to claim 6 wherein, should the transistor be made of InP or its alloys, the laser emits a pulsed radiation with a wavelength ≦1500 nm.

9. A sample-and-hold unit according to claim 6 wherein, in order to reduce the uncertainty over the switching time of the transistor, the semiconductor laser is biased by a DC current corresponding to its threshold of optical emission.

10. A sample-and-hold unit according to claim 6, wherein the transistor includes at least one channel region made of materials of the III-V group such as GaAs, InP and their ternary and quaternary alloys.

* * * * *